TRANSISTOR AMPLIFIER AND POWER SUPPLY THEREFOR

Filed Nov. 9, 1950 2 Sheets-Sheet 1

INVENTORS. G. RAISBECK
R. L. WALLACE, JR.
BY Harry C. Hart
ATTORNEY

Jan. 19, 1954 G. RAISBECK ET AL 2,666,817

TRANSISTOR AMPLIFIER AND POWER SUPPLY THEREFOR

Filed Nov. 9, 1950 2 Sheets-Sheet 2

INVENTORS. G. RAISBECK
R. L. WALLACE, JR.
BY Harry C. Hart
ATTORNEY

Patented Jan. 19, 1954 2,666,817

UNITED STATES PATENT OFFICE 2,666,817

TRANSISTOR AMPLIFIER AND POWER SUPPLY THEREFOR

Gordon Raisbeck, Morristown, and Robert Lee Wallace, Jr., Plainfield, N. J., assignors to Bell Telephone Laboratories, Incorporated, New York, N. Y., a corporation of New York Application November 9, 1950, Serial No. 194,834

11 Claims. (Cl. 179—171)

This invention relates to transistor translating circuits, e. g., transistor amplifiers and the power supplies therefor.

A principal object of the invention is to apply the emitter and collector bias currents which are required by the transistor electrodes (for satisfactory operation) from a single current source.

A related object is to supply the emitter and collector bias currents required by the several stages of a multistage transistor amplifier from a single source.

A subsidiary object is to provide a multistage transistor amplifier of compact and economical design.

It has been known for some time that the operation of a transistor as an amplifier is best controlled by adjustment of currents, as distinguished from voltages, which are supplied as operating biases to the emitter and collector electrodes, respectively. As a practical matter, the most convenient current source which is readily available to engineers comprises a voltage source in series with a resistor whose ohmic value is high compared with other series resistances in the circuit. When such a source is provided as the emitter current supply of each of a number of stages and also as the collector current supply of each of a number of stages, the result is a highly uneconomical duplication of apparatus. Additionally, each separate source involves a loss of power in its internal resistance.

In one aspect the present invention supplies to the emitter and to the collector respectively of a transistor amplifier a bias current in a desired and controlled amount by the inclusion, in series with each of the input terminals, of a correctly proportioned resistor and by the further inclusion of another correctly proportioned resistor in series with each of the two output terminals. These resistors may be proportioned, in relation to the self-resistances of the transistor and to the external current bias source, to furnish emitter bias current and collector bias current in the proper amounts and at the same time.

The foregoing holds independently of whether the configuration of the amplifier is of grounded base or grounded emitter variety, though the proportionment of the individual resistors is of course different in the two cases.

In another aspect the invention is based upon the recognition that, inasmuch as each transistor amplifier requires operating biases in the form of currents instead of voltages, these biases may be conveniently provided for all of the several stages of a multistage transistor amplifier by connecting them in series from the direct-current standpoint while in cascade from the signal standpoint. Each stage includes the resistors discussed above.

When the resistors have been properly proportioned and the biasing current has been applied to the multistage amplifier there naturally exists across the resistors a certain distribution of voltage drops; and this voltage drop distribution is unavoidably modified when a signal is applied to the input terminals of the amplifier as a whole, by the resulting output currents of the several stages. By the same token this modification is greatest in the final stage. In accordance with another aspect of the invention this modification of distribution of voltage drops is minimized by inverting some stages relatively to others. In particular the last stage may be inverted with respect to all of the other stages.

In order to avoid signal frequency power losses in the resistors which are provided for bias current adjustment, these resistors may be bypassed, individually or in groups, by condensers in a fashion which is well known in the vacuum tube amplifier art.

The invention will be fully apprehended from the following detailed description of preferred embodiments thereof, taken in conjunction with the appended drawings of which:

Figure 1:
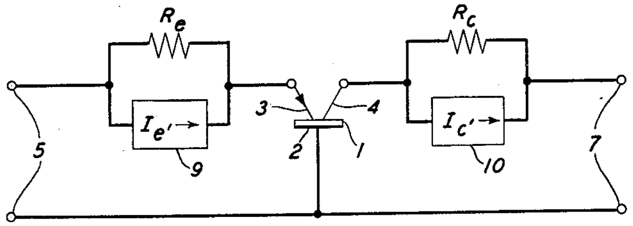
Fig. 1 shows a one-stage transistor amplifier with conventional bias current supply.

Referring now to the drawings Fig. 1 shows an amplifier comprising a transistor having a semiconductive body 1, a base electrode 2, an emitter electrode 3, and a collector electrode 4. The transistor is connected in the grounded base configuration, that is to say, with input terminals 5 connected to the base 2 and to the emitter 3, respectively, and output terminals 7 connected to the base 2 and a collector 4, respectively. As is now well known, a transistor operates with greatest reliability when supplied with biases in the form of an emitter current and a collector current of preassigned magnitudes. The emitter current may be derived from a source 9 of current $I_e'$ with which is associated a resistance $R_e$, which may be the internal resistance of the current source 9. Similarly, the collector current supply may be derived from a source 10 of current $I_c'$ with which is associated a resistance $R_c$, which may again be the internal resistance of the source 10.

Ideally, in order to provide the emitter 3 and the collector 4 with operating bias currents which are absolutely constant, the resistances $R_e$ and $R_c$ must be infinite. As a practical matter, however, it is only necessary that the resistance $R_e$ be large compared with the internal emitter and base resistances of the transistor and that, correspondingly, the resistance $R_c$ be large compared with the combined collector and base resistances of the transistor.

As a practical matter, furthermore, it is not economical to provide two independent current sources when one could serve. Thus the independency of the two current sources 9, 10 of Fig. 1 is a restriction to be avoided if possible. The restriction is the more serious as the number of stages of the amplifier is increased. Thus, in the case of an amplifier of three stages each similar to that of Fig. 1, six independent sources would be required.

Figure 2:
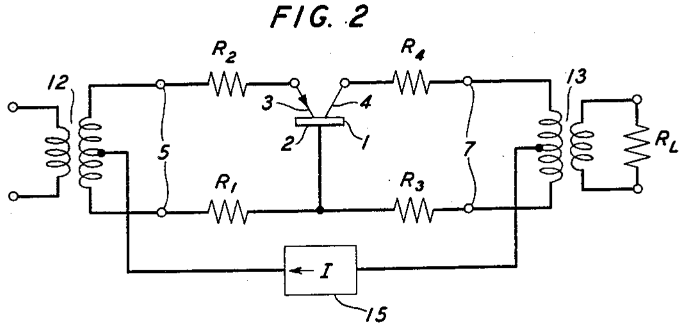
Fig. 2 is a schematic diagram showing a one-stage transistor amplifier embodying the single-supply feature of the invention.

The present invention furnishes a means and a method by which a single source may be employed for the emitter current and for the collector current of any one or several transitor amplifier stages. Referring to Fig. 2, a transistor like that of Fig. 1 is provided and, like that of Fig. 1, is connected in the grounded base configuration. The signal input is applied to the emitter 3 and to the base 2 by way of an input transformer 12 and the signal output is derived from the base 2 and the collector 4 of the transistor and applied to a load $R_L$ by way of an output transformer 13. External resistors $R_1$ and $R_2$ are connected in series with the input terminals 5 and external resistors $R_3$ and $R_4$ are connected in series with the output terminals 7. A single source 15 of bias current I is connected between the mid-point of the secondary winding of the input transformer 12 and the mid-point of the primary winding of the output transformer 13.

Evidently, the emitter current, the base current and the collector current of the transistor in Fig. 1 may be determined in terms of the two external currents $I_e'$ and $I_c'$ and the associated resistors $R_e$ and $R_c$. Similarly, in Fig. 2, the electrode currents of the transistors may be formulated in terms of the external resistors $R_1$, $R_2$, $R_3$ and $R_4$ and the external supply current I. When these two different formulations are made and when, further, they are conditioned by equating the transistor electrode currents in the two cases, mathematical relations are obtained which hold between the four controllable quantities of Fig. 1 and the four external resistors of Fig. 2. In particular it turns out that:

$$\left.\begin{aligned} I_e' &= I\frac{R_1}{R_1+R_2} \\ R_e &= R_1+R_2 \\ I_c' &= I\frac{R_3}{R_3+R_4} \\ R_c &= R_3+R_4 \end{aligned}\right\} \quad (1)$$

Now it will be observed that the four controllable quantities of Fig. 1 are explicitly given in the above equations as functions of the external resistors of Fig. 2 and of the supply current I. These four equations may be solved simultaneously to give explicit solutions for the external resistors $R_1$, $R_2$, $R_3$ and $R_4$ of Fig. 2 in terms of the controllable quantities of Fig. 1 and of the independently selectable external supply current I. The result is as follows:

$$\left.\begin{aligned} R_1 &= R_e\frac{I_e'}{I} \\ R_2 &= R_e\left[1-\frac{I_e'}{I}\right] \\ R_3 &= R_c\frac{I_c'}{I} \\ R_4 &= R_c\left[1-\frac{I_c'}{I}\right] \end{aligned}\right\} \quad (2)$$

Thus for a given value of I it is possible to find a set of values of $R_1$, $R_2$, $R_3$ and $R_4$ which give any desired power supply currents $I_e'$ and $I_c'$ and source impedances $R_e$ and $R_c$ over a certain range of values. In practice the range can be extended as far as may be desired by employing a sufficiently large value of the external supply current I.

Figure 3:
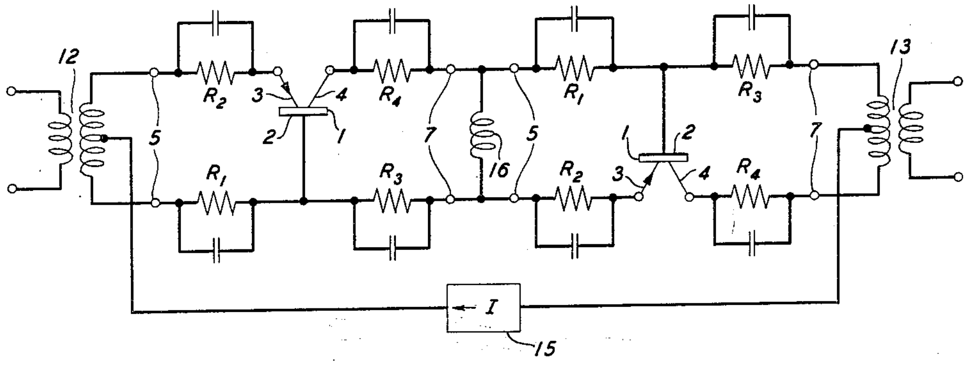
Fig. 3 is a schematic diagram showing a two-stage transistor amplifier in which each of the bias current-adjusting resistors of Fig. 2 is bypassed by an individual condenser; and in which the stages are relatively inverted.

Because the supply current I is supplied by way of the windings of the input and output transformers 12, 13, across which there can be no direct-current difference of potential in the ideal case, and, as a practical matter, only a negligible direct-current potential difference, the upper branch of the circuit of Fig. 2 effectively coalesces with the lower branch both at the input terminals 5 and at the output terminals 7, the current from the supply source I which enters the mid-point of the input transformer 12 and leaves the mid-point of the output transformer 13 being in each case the sum of the upper branch current and the lower branch current. Therefore amplifiers such as those of Fig. 2 may effectively be connected in cascade without requiring the addition of any additional current bias supply sources. Fig. 3 shows such an arrangement where the supply current I is applied from its source 15 to the mid-point of the secondary winding of the input transformer 12 of the first stage and withdrawn from the mid-point of the primary winding of the output transformer 13 of the second stage while the output terminals 7 of the first stage and the input terminals 5 of the second stage are effectively short-circuited from the direct-current standpoint by an inductance coil 16 connected in shunt across them. This coil is effectively an open circuit from the signal frequency standpoint and takes no part in the signal frequency operation of the system while, because it is an effective short circuit from the direct-current standpoint, it permits the emitter and collector currents of the second stage to be determined in the same way as for the first stage in the manner described above.

The added resistors $R_1$, $R_2$, $R_3$ and $R_4$ would evidently introduce signal frequency losses unless by-passed. They can be by-passed individually by condensers as shown in Fig. 3 or, if preferred, a single condenser may be employed to by-pass the output resistor $R_4$ of one stage and the input resistor $R_1$ of the following stage as shown in Fig. 4.

Figure 4:
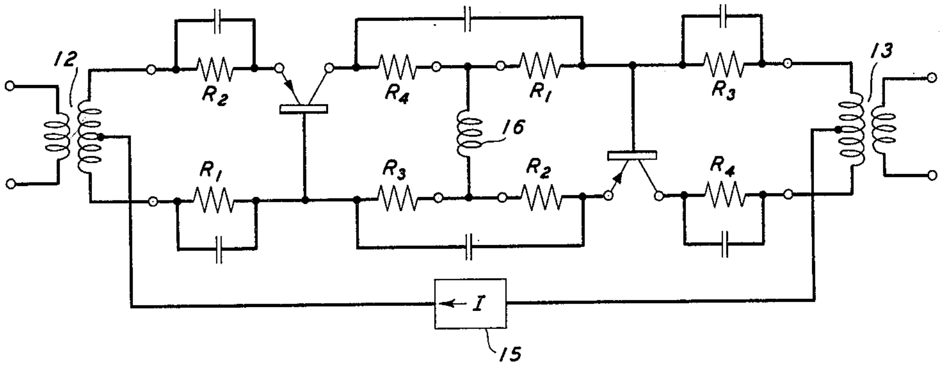
Fig. 4 is a schematic diagram showing another variant of Fig. 2 in which a plurality of the individual by-pass condensers of Fig. 3 are replaced by a single by-pass condenser.

It will be observed that the second stage of Figs. 3 and 4 is inverted with respect to the first; that is to say the collector 4 of the first stage is connected to the base 2 of the second, while the base 2 of the first stage is connected to the emitter 3 of the second. The reason for this inversion is as follows. In the case of a practical source 15 of the external current I, as distinguished from an ideal one of infinite internal resistance, and assuming that each stage of the multistage amplifier has gain then, when an input signal is applied, the total voltage drop across each stage is reduced as the emitter current of that stage is increased because of the presence of the signal. If all the stages were connected symmetrically or "right side up" then the currents in all the emitters would be in phase, and the voltage drops due to the signal across the several stages would vary in phase addition. This places severe demands on the constancy of the current of the supply source 15, which must maintain its constant current despite considerable variations in voltage. However, if one stage is inverted with respect to the next, then the voltage drops of succeeding stages are in phase opposition and the sum of the variations of voltage drop is considerably diminished. This reduces the demands placed on the current regulation of source 15. In cases of more than two stages, and especially when each stage furnishes a large amount of amplification so that the variation of voltage drop in each stage is several times as great as the variation in the voltage drop of the previous stage, then it is advantageous to orient all of the transistors alike except the last one, and to orient it in the opposite way from the others. In this way the variations in voltage drop of all the earlier stages combine to cancel, for the most part, the variation in voltage drop across the final stage.

The inversion of any stage with respect to the preceding stage as shown in Figs. 3 and 4 offers various advantages quite apart from the matter of compensation of signal frequency voltage drops and the resulting reduction of demands on the current supply source 15. A principal point at which the grounded base transistor departs from exact duality with the grounded cathode vacuum tube is that while the latter is characterized by a phase reversal of its output with respect to its input, the former is not. Therefore, the cascaded transistor amplifier in which alternate stages are inverted is more nearly the exact dual counterpart of the conventional cascaded vacuum tube amplifier than is a transistor amplifier in which all the stages are "right side up." This has many advantages which are suggested by the known circuit techniques developed for use with vacuum tubes.

Figure 5:
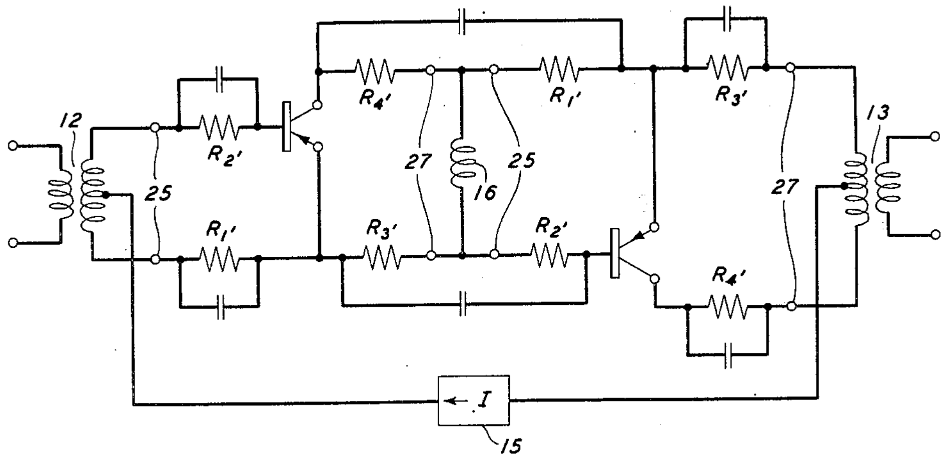
Fig. 5 is a schematic diagram showing a variant of Fig. 3 in which the individual transistor amplifier stages are of the grounded emitter configuration.

The invention is equally applicable to transistor amplifiers of the grounded emitter configuration, of which Fig. 5 is a schematic diagram. As before, four external resistors $R_1'$, $R_2'$, $R_3'$, and $R_4'$ are connected in series with the input terminals 25 and the output terminals 27 of each stage. A choke coil 16 offering a minimum impedance to direct-current and being substantially an open circuit at signal frequencies is connected in shunt with the output terminals 27 of each stage and the input terminals 25 of the following stage and a source 15 of supply current I is connected to the mid-point of the secondary winding of the input transformer 12 of the first stage and withdrawn from the mid-point of the primary winding of the output transformer 13 of the last stage. As before, too, the several stages may be inverted with respect to each other. The magnitudes of the required external resistors $R_1'$, $R_2'$, $R_3'$, $R_4'$, and of the required external supply current I are of course individually different for the grounded base connection of Figs. 2, 3, and 4 and the grounded emitter connection of Fig. 5.

While the invention has been described in terms of four individual external resistors $R_1$, $R_2$, $R_3$ and $R_4$, this is for explanatory and illustrative purposes, and for the sake of generality. In particular cases, as indicated by Equations 2 it may well turn out that any particular one or more of these resistors will have the value zero and may therefore be omitted as a physical element from the circuit. Therefore mathematical reduction of the magnitude of any of these resistors to zero and consequent physical removal of the resistor element from the circuit is contemplated as being within the scope of the invention.

What it claimed is:

1. An amplifier which comprises a transistor having a base electrode, an emitter, and a collector, input terminals connected to two of said electrodes, output terminals connected to one of said two electrodes and to the third electrode, a resistor connected in series between each of said terminals and the transistor electrode to which it is connected, a first inductance coil interconnecting said input terminals, a second inductance coil interconnecting said output terminals, a substantially steady bias current source having two terminals, one of said source terminals being connected directly to said first coil and the other of said source terminals being connected directly to said second coil, said several resistors being proportioned, in relation to the self-resistances of the transistor and to the current source resistance, to hold the total current of said source substantially constant and to supply a first desired fraction of said total current as a bias current to the emitter and a second desired fraction thereof as a bias current to the collector.

2. An amplifier which comprises a transistor having a base electrode, an emitter, and a collector, input terminals connected to two of said electrodes, output terminals connected to one of said two electrodes and to the third electrode, a resistor connected in series between each of said terminals and the transistor electrode to which it is connected, a first impedance element interconnecting said input terminals, a second impedance element interconnecting said output terminals, a substantially steady bias current source having two terminals, one of said source terminals being connected directly to said first element and the other of said source terminals being connected directly to said second element, each of said elements presenting an impedance of substantial magnitude at signal frequencies and a substantially zero impedance to direct currents, said several resistors being proportioned, in relation to the self-resistances of the transistor and to the current source resistance, to hold the total current of said source substantially constant and to supply a first desired fraction of said total current as a bias current to the emitter and a second desired fraction thereof as a bias current to the collector.

3. An amplifier which comprises a transistor having a base electrode, an emitter, and a collector, input terminals connected to the base electrode and to the emitter, output terminals connected to the base electrode and to the collector, a resistor connected in series between each of said terminals and the transistor electrode to which it is connected, a first inductance coil interconnecting said input terminals, a second inductance coil interconnecting said output terminals, a substantially steady bias current source having two terminals, one of said source terminals being connected directly to said first coil and the other of said source terminals being connected directly to said second coil, said several resistors being proportioned, in relation to the self-resistances of the transistor and to the current source resistance, to hold the total current of said source substantially constant and to supply a first desired fraction of said total current as a bias current to the emitter and a second desired fraction thereof as a bias current to the collector.

4. An amplifier which comprises a transistor having a base electrode, an emitter, and a collector, input terminals connected to two of said electrodes, output terminals connected to one of said two electrodes and to the third electrode, a resistor connected in series between each of said terminals and the transistor electrode to which it is connected, a first inductance coil interconnecting said input terminals, a second inductance coil interconnecting said output terminals, a substantially steady bias current source having two terminals, one of said source terminals being connected directly to said first coil and the other of said source terminals being connected directly to said second coil, said several resistors being proportioned, in relation to the self-resistances of the transistor and to the current source resistance, to hold the total current of said source substantially constant and to supply a first desired fraction of said total current as a bias current to the emitter and a second desired fraction thereof as a bias current to the collector.

5. A multistage amplifier of which each stage comprises a transistor having a base electrode, an emitter, and a collector, input terminals connected to two of said electrodes, output terminals connected to one of said two electrodes and to the third electrode, said one electrode thus being common to the input and output circuits, a resistor connected in series between each of said terminals and the transistor electrode to which it is connected, the output terminals of each stage being directly connected to the input terminals of the following stage, an element presenting substantial impedance at signal frequencies and negligible impedance to direct currents interconnecting the input terminals of the first stage, a similar element interconnecting the output terminals of the last stage, and a current supply source directly interconnecting said input element with said output element, said several resistors being proportioned, in relation to the self-resistances of the transistor and to the current source resistance, to hold the total current of said source substantially constant and to supply a first desired fraction of said total current as a bias current to the emitter and a second desired fraction thereof as a bias current to the collector.

6. Apparatus as defined in claim 5 wherein the several resistors of each stage are proportioned to supply a desired fraction of the current of the supply source as a bias current to the emitter of said stage and a desired fraction of the current of said supply source as a bias current to the collector of said stage.

7. Apparatus as defined in claim 5 wherein each of said elements is an inductance coil.

8. Apparatus as defined in claim 5 wherein at least one stage is inverted with respect to the preceding stage.

9. Apparatus as defined in claim 5 wherein the common transistor electrode of one stage is connected to the non-common input terminal of the following stage.

10. Apparatus as defined in claim 5 wherein the common transistor electrode of one stage is connected to the non-common output terminal of the preceding stage.

11. In combination with apparatus as defined in claim 5, an element presenting substantial impedance at signal frequencies and negligible impedance to direct currents interconnecting each pair of interstage connection points.

GORDON RAISBECK.
ROBERT LEE WALLACE, JR.

References Cited in the file of this patent

UNITED STATES PATENTS

| Number | Name | Date |
|---|---|---|
| 2,486,776 | Barney | Nov. 1, 1949 |
| 2,517,960 | Barney | Aug. 8, 1950 |
| 2,541,322 | Barney | Feb. 13, 1951 |
| 2,553,490 | Wallace | May 15, 1951 |
| 2,556,286 | Meacham | June 12, 1951 |
| 2,585,078 | Barney | Feb. 12, 1952 |
| 2,620,448 | Wallace | Dec. 2, 1952 |